United States Patent
Lu et al.

(10) Patent No.: US 10,168,385 B2
(45) Date of Patent: Jan. 1, 2019

(54) EYE PATTERN MEASUREMENT APPARATUS, AND CLOCK AND DATA RECOVERY SYSTEM AND METHOD OF THE SAME

(71) Applicant: MStar Semiconductor, Inc., Hsinchu Hsien (TW)

(72) Inventors: Wen cai Lu, Shanghai (CN); Hu Xiao, Shanghai (CN)

(73) Assignee: MSTAR SEMICONDUCTOR, INC., Hsinchu Hsien (TW)

(*) Notice: Subject to any disclaimer, the term of this patent is extended or adjusted under 35 U.S.C. 154(b) by 0 days.

(21) Appl. No.: 15/703,264

(22) Filed: Sep. 13, 2017

(65) Prior Publication Data

US 2018/0083604 A1    Mar. 22, 2018

Related U.S. Application Data

(60) Provisional application No. 62/397,348, filed on Sep. 21, 2016.

(51) Int. Cl.
| | |
|---|---|
| G01R 31/317 | (2006.01) |
| H04B 17/10 | (2015.01) |
| G06F 1/04 | (2006.01) |
| H04B 10/079 | (2013.01) |
| H04B 17/00 | (2015.01) |
| H04L 1/20 | (2006.01) |
| H03K 5/135 | (2006.01) |
| G01R 31/3193 | (2006.01) |

(52) U.S. Cl.
CPC . *G01R 31/31708* (2013.01); *G01R 31/31937* (2013.01); *G06F 1/04* (2013.01); *H03K 5/135* (2013.01); *H04B 10/0795* (2013.01); *H04B 17/0085* (2013.01); *H04B 17/104* (2015.01); *H04L 1/20* (2013.01); *H04L 1/205* (2013.01)

(58) Field of Classification Search
CPC .................. H03K 5/135; G01R 31/31708
See application file for complete search history.

(56) References Cited

U.S. PATENT DOCUMENTS

| | | | |
|---|---|---|---|
| 7,460,589 B2 | 12/2008 | Fujimori et al. | |
| 2007/0047680 A1 | 3/2007 | Okamura | |
| 2008/0177489 A1 | 7/2008 | Cranford et al. | |
| 2010/0283480 A1 | 11/2010 | Nagatani et al. | |
| 2011/0170644 A1* | 7/2011 | Iqbal | H04L 7/0337 375/355 |

* cited by examiner

*Primary Examiner* — Daniel Puentes
(74) *Attorney, Agent, or Firm* — WPAT, PC

(57) ABSTRACT

An eye pattern measurement apparatus includes: an eye pattern monitoring device, performing first sampling on a data signal by sequentially using scan clock signals having different phases to obtain a plurality of scan data signals; and a data aligning device, connected to the eye pattern monitoring device, receiving the scan data signals outputted by the eye pattern monitoring device, performing phase-shift on the first clock signal to generate a synchronization clock signal, synchronizing the scan data signals with the synchronization clock signal, and outputting the synchronized scan data signals.

15 Claims, 8 Drawing Sheets

EYE PATTERN MEASUREMENT APPARATUS, AND CLOCK AND DATA RECOVERY SYSTEM AND METHOD OF THE SAME

This application claims the benefit of U.S. Provisional Application Ser. No. 62/397,348, filed Sep. 21, 2016, the subject matter of which is incorporated herein by reference.

BACKGROUND OF THE INVENTION

Field of the Invention

The invention relates in general to the field of signal processing, and more particularly to an eye pattern measurement apparatus, and a clock and data recovery system and method thereof.

Description of the Related Art

In data communications such as high-speed serial data communications, to save resources, usually only data signals, but not clock signals synchronous with the data signals, are transmitted. Thus, to ensure synchronization of data processing, a data receiving terminal needs to extract timing information such as a clock from the received data, so as to further perform "re-timing" on the data by using the clock to eliminate jittering accumulated during the transmission process. This process of extracting the clock and data re-timing is referred to as "clock and data recovery" (CDR).

Further, for data obtained from transmission, eye quality of an eye pattern of the data usually needs to be measured to obtain the performance of the data transmission system. Currently, the eye pattern measurement directly outputs scan data, which is acquired from sampling by using multiple different clock signals having a period equal to the period of the above extracted clock signal, and the eye quality of the received data is then obtained accordingly. However, the scan data in fact is asynchronous from the above extracted clock signal, and the subsequent sampling of the scan data by using the extracted clock signal may fail to satisfy a setup/hold time requirement, leading to synchronization data errors.

SUMMARY OF THE INVENTION

It is an object of the present invention to provide an eye pattern measurement apparatus and a clock and data recovery (CDR) system and method thereof to prevent data errors in the synchronization of scan data signals obtained from eye pattern measurement and clock signals.

To solve the above issues, the present invention discloses an eye pattern measurement apparatus including an eye pattern monitoring device and a data aligning device. The eye pattern monitoring device performs first sampling on a data signal by sequentially using multiple scan clock signals having different phases to obtain multiple scan data signals. The periods of the multiple scan clock signals are equal to the period of the first clock signal synchronous with the data signal. The data aligning device performs phase-shift on the first clock signal to generate a synchronization clock signal having a phase relationship, with the scan data signals, that satisfies a setup/hold time requirement. The scan data signals are synchronized with the synchronization clock signal, and the synchronized scan clock signals are outputted. The phase of the synchronization clock signal further satisfies a condition that, a phase relationship between the scan data signals synchronized by the synchronization clock signal and the first clock signal further satisfies the setup/hold time requirement.

To solve the above issues, the present invention further discloses a clock and data recovery (CDR) system including: a CDR apparatus and the above eye pattern measurement apparatus. The CDR apparatus extracts, from a received data clock, a first clock signal synchronous with the received data clock, and outputs the first clock signal and the received data signal serving as a data signal. The eye pattern measurement apparatus is connected to the CDR apparatus.

To solve the above issues, the present invention further discloses a data signal processing method including: performing first sampling on a data signal by sequentially using multiple scan clock signals having different phases to obtain multiple scan data signals; performing phase-shift on the first clock signal to generate a synchronization clock signal, wherein a phase relationship between the synchronization clock signal and the scan data signals satisfies a setup/hold time requirement; and synchronizing the scan data signals with the synchronization clock signal to obtain synchronized scan data signals, wherein the phase of the synchronization clock signal further satisfies a condition that, a phase relationship between the scan data signals synchronized by the synchronization clock signal and the first clock signal further satisfies the setup/hold time requirement.

The main technical issues solved by the present invention are that, in the above solutions, scan data signals representing eye quality is obtained by scanning the data signal, first phase-shift is performed on the first clock signal to obtain a synchronization clock signal that enables a phase relationship between a first clock signal and scan data signals to satisfy a setup/hold time requirement, and the synchronization clock signal can be accordingly used to sample the scan data signals to achieve synchronization, thereby realizing the measurement of an eye pattern. Further, because the synchronization clock signal does not sample jump areas of the scan data signals obtained from eye pattern measurement, the current process of synchronization does not cause data errors. Meanwhile, as the synchronized scan data signals and the first clock signal satisfy the setup/hold time requirement, the subsequently synchronization of the synchronized scan data signals with the first clock signal is also free from data errors.

The above and other aspects of the invention will become better understood with regard to the following detailed description of the preferred but non-limiting embodiments. The following description is made with reference to the accompanying drawings.

DETAILED DESCRIPTION OF THE INVENTION

Terms in the following description are customary terms in the technical field. If a part of the terms are described or defined, these terms are explained based on the description or definition of the application.

In the description below, for illustration rather than limitation purposes, specific details of predetermined system structures, interfaces and technologies are disclosed to better and more thoroughly understand the disclosure.

In the disclosure, the term "and/or" is merely an association relationship describing associated objects, and indicate three possible relationships. For example, A and/or B may indicate three situations including: A exists independently, A and B exist simultaneously, and B exists independently. Further, the symbol "/" in the disclosure generally indicates that former and latter associated objects have an "or" relationship.

Figure 1:
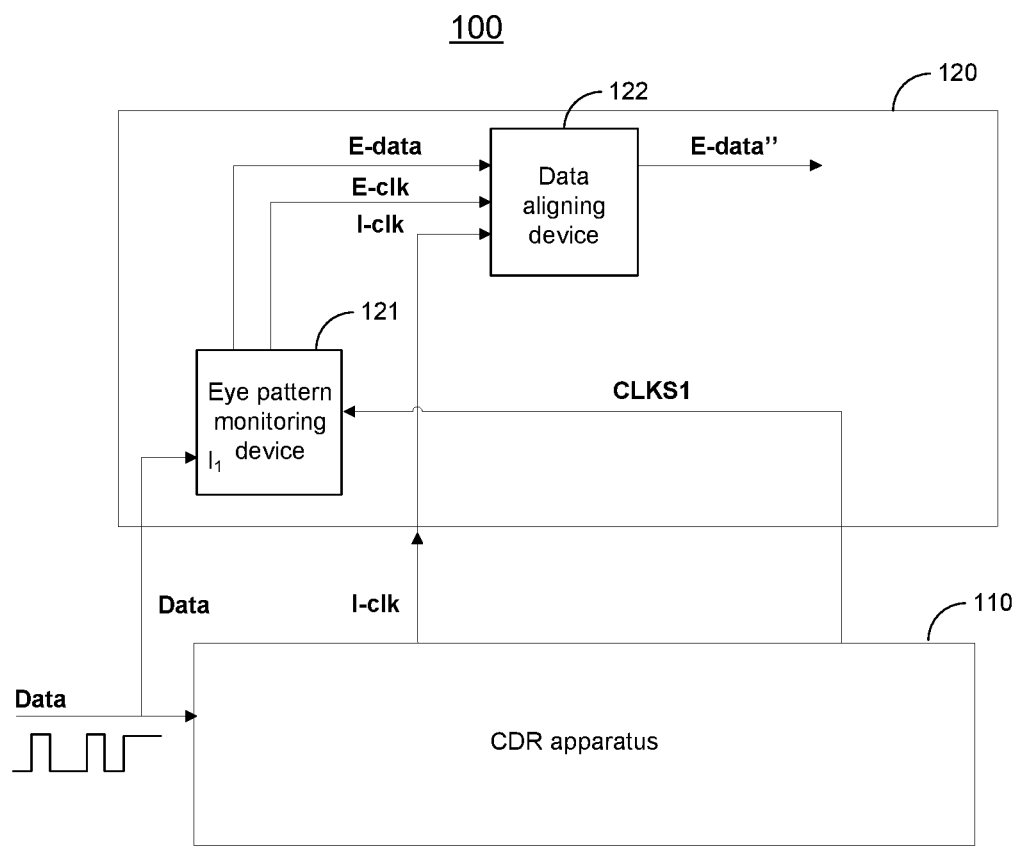
FIG. 1 is a schematic diagram of a clock and data recovery (CDR) system according to an embodiment of the present invention.

FIG. 1 shows a schematic diagram of a clock and data recovery system (CDR) system according to an embodiment of the present invention. For example, in this embodiment, the system 100 may be any apparatus having a signal processing capability, e.g., a television, a set-top box (STB) or a computer, or a circuit with a signal processing capability applied in the above apparatuses. The system 100 serves as a receiving terminal, and receives, via a Serializer-Deserializer (SERDES) interface, a high-definition display interface such as DisplayPort (DP) interface, a High-Definition Multimedia Interface (HDMI), a Digital Video Interface (DVI) or a USB3.0 interface, a data signal Data transmitted from a transmitting terminal. The CDR system 100 includes a CDR apparatus 110 and an eye pattern measurement apparatus 120.

The CDR apparatus 110 receives the data signal Data, recovers a first clock signal I-clk from the data signal Data, and outputs the data signal Data and the first clock signal I-clk to the eye pattern measurement apparatus 120. More specifically, the transmitting terminal transmits only the data signal but not a clock signal synchronous with the data signal. Therefore, the receiving terminal receives the data signal Data, and needs to extract the first clock signal I-clk synchronous with the data signal Data from the data signal Data by using the CDR apparatus 110. The first clock signal I-clk and the data signal Data have a phase relationship that ensures an optimal sampling point for sampling the data signal.

Figure 2A:
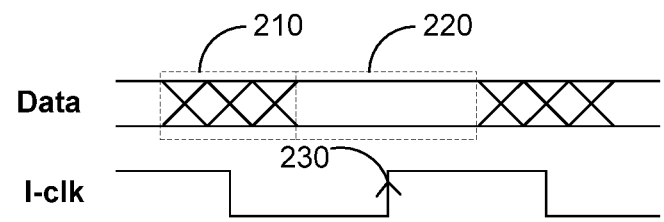
FIG. 2A and FIG. 2B are waveform diagrams of a part of the signals adopted in an application scenario of the present invention.
Figure 2B:
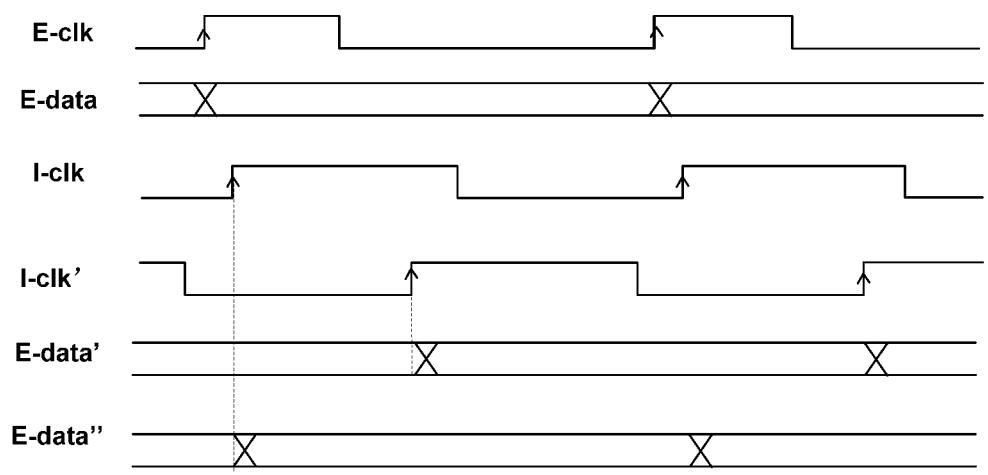

FIG. 2A and FIG. 2B are waveform diagrams of a part of the signals adopted in an application scenario of the present invention. As shown in FIG. 2A, a denoted part 210 of the data signal Data indicates a data jump, and a blank part 220 is an open eye window in the eye pattern and corresponds to a region without any data jump. The CDR apparatus 110 aligns a triggering edge 230 (throughout of the specification, a rising edge is used as an example of the triggering edge of the clock signal for illustration purposes, and may be a falling edge in other embodiments) of the first clock signal I-clk with a center of the data signal Data (i.e., the center position of the open eye window 220). Thus, when the signal data Data is again sampled later by using the first clock signal I-clk, the position of the triggering edge is located farthest from the edges of the adjacently preceding and subsequent data jumps, providing a maximum margin with respect to issues of jittering and uncertain timings.

The CDR apparatus 100 further performs multiple rounds of phase-shift on the first clock signal I-clk to obtain a first set of scan clock signals CLKS1, and outputs the first set of scan clock signals CLKS1 to the eye pattern measurement apparatus 120. The periods of the first set of scan clock signals CLKS1 are equal to the period of the first clock signal I-clk, and the scan clock signals in the first set of scan clock signals CLKS1 have different phases.

The eye pattern measurement apparatus 120 includes an eye diagram monitoring device 121 and a data aligning device 122 connected to the eye pattern monitoring device 121.

The eye pattern monitoring device 121 receives the data signal Data and the first set of scan clock signals CLKS1 outputted by the CDR apparatus 110, performs first sampling on the data signal Data by sequentially using the first set of scan clock signals CLKS1 to obtain a set of scan data signals E-data, and transmits the scan data signals E-data to the data aligning device 122. The set of scan data signals E-data may be used to estimate an open level of an eye of the data signal Data to further monitor the transmission path quality. The eye pattern monitoring device 121 further generates a set of second clock signals E-clk from the corresponding first set of scan clock signals CLKS1. The set of second clock signals E-clk have a same frequency as the first set of scan clock signals CLKS1. The set of second clock signals E-clk corresponds to the set of scan data signals E-data; that is, the center of a jump area of each of the scan data signals E-data corresponds to a rising edge of the corresponding second clock signals E-clk, as shown in FIG. 2B.

In one embodiment, the scan clock signals in the first set of scan clock signals CLKS1 have a first phase, a second phase . . . , respectively. A scan data signal E-data0 and a second clock signal E-clk0 thereof are obtained when the eye pattern monitoring device 121 performs sampling by using a scan clock signal having the first phase in the first set of scan clock signals CLKS1; a scan data signal E-data1 and the second clock signal E-clk1 thereof are obtained when the eye pattern monitoring device 121 performs sampling by using a scan clock signal having the second phase in first the set of scan clock signals CLKS1; a scan data signal E-data2 and the second clock signal E-clk2 thereof are obtained when the eye pattern monitoring device 121 performs sampling by using a scan clock signal having the third phase in the first set of scan clock signals CLKS1; . . . and so forth. The phase of each scan clock signal in the first set of scan clock signals is a value between 0 to 360 degrees, and the scan clock signals are spaced by a predetermined phase difference $\Delta\varphi$. Correspondingly, the obtained scan data signals E-data and the second clock signals E-clk are also have the predetermined phase difference $\Delta\varphi$. In one embodiment, assuming the phase difference $\Delta\varphi$ is 5.626° and the set of second clock signals E-clk include 64 second clock signals, the phases of the set of second clock signals E-clk are then 0°, 5.625°, 11.25°, . . . and 354.375°, respectively.

The data aligning device 122 receives the set of scan data signals E-data and the set of second clock signals E-clk outputted from the eye pattern monitoring device 121, and the first clock signal I-clk outputted from the CDR apparatus 110. Further, the data aligning device 122 performs phase-shift on the fist clock signal I-clk according to the phase relationship between the set of second clock signals E-clk and the first clock signal I-clk (in practice, the phase difference between each second clock signal E-clk in the set of second clock signals E-clk and each first clock signal I-clk may be any value) to generate a synchronization clock signal I-clk', synchronizes the scan data signal E-data with the synchronization signal I-clk' to generate a synchronized scan data signal E-data', and synchronizes the scan data signal E-data' with the first clock signal I-clk to output a synchronized scan data signal E-data". The data aligning device 122 may select and output the first clock signal I-clk or the synchronization clock signal I-clk', or does not output a clock signal according to requirements. FIG. 1 depicts an example of not outputting the clock signal.

The phase of the synchronization clock signal I-clk' generated by the data aligning device 122 satisfies a condition that, a phase relationship between the synchronization clock signal I-clk' and the scan data signals E-data satisfies a setup/hold time requirement. Taking the phase shown in FIG. 2B for example, the triggering edge of the synchronization clock signal I-clk' is not located in the jump area of the scan data signal E-data. As such, the scan data signal E-data' is synchronous with the synchronization clock signal I-clk', and the synchronization clock signal I-clk' is obtained from time-shifting the first clock signal I-clk. Thus, if the synchronization clock signal I-clk' is appropriately selected, the scan data signal E-data' and the first clock signal I-clk similarly satisfy the setup/hold time requirement; that is, the triggering edge of the first clock signal I-clk is not located in the jump area of the synchronized scan data signal E-data' (as shown in FIG. 2B). Therefore, the jump area of the scan data signal E-data is not sampled when the synchronization clock signal I-clk' used, and this round of synchronization does not cause any errors. Meanwhile, when the synchronized scan data signal E-data' is subsequently synchronized with the first clock signal I-clk, the jump area of the scan data E-data' is not sampled, and this round of synchronization does not cause any errors either.

In conclusion, even if the edge of the second clock signal E-clk is close to the rising edge of the first clock signal I-clk, through the above operation, no data errors are caused when the scan data signal E-data' and the extract clock (the first clock signal I-clk) are used to again perform sampling (i.e., obtaining the scan data signal E-data").

In one embodiment, absolute values of differences between the synchronization clock signal I-clk', the scan data signal E-data and the first clock signal I-clk should be greater than a predetermined difference; the predetermined difference should be greater than a circuit delay generated during the synchronization of the scan data signal E-data by using the synchronization clock signal I-clk'.

The above phase relationship satisfying the setup/hold time requirement may be determined according to an actual application. For example, according to the setup/hold time requirement of a device (e.g., a first trigger below) for implementing the sampling of the scan data signal E-data by using the synchronization clock signal I-clk', as well as the setup/hold time requirement of a device (e.g., a third trigger below) for implementing the sampling of the synchronized scan data signal E-data' (i.e., generating the data signal E-data") by using the first clock signal I-clk, the corresponding phase relationship may be determined.

Figure 3:
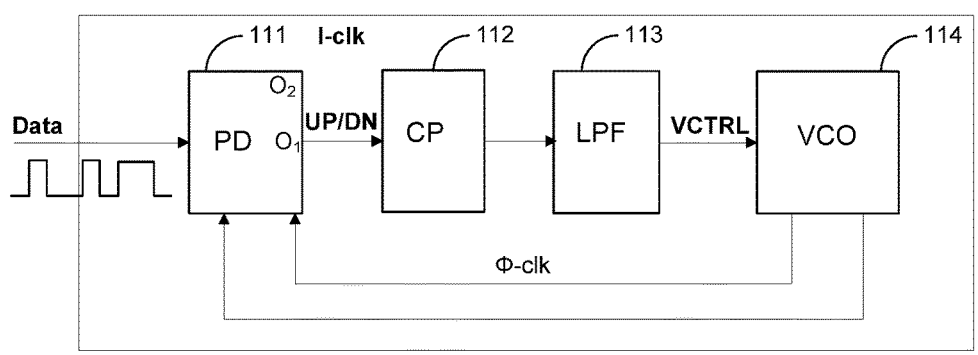
FIG. 3 is a schematic diagram of a CDR apparatus 110 according to an embodiment of the present invention.

FIG. 3 shows a schematic diagram of the CDR apparatus 110 according to an embodiment of the present invention. In this embodiment, the CDR apparatus 110 is a phase-locked loop (PLL) circuit, and includes phase detector (PD) 111, a charge pump (CP) 112, a loop filter (LPF) 113 and a voltage-controlled oscillator (VCO) 114 that are sequentially connected. Further, an output end of the VCO 114 is connected to the PD 111. An input end of the CDR apparatus 110, i.e., an input end of the PD 111, is connected to a first input end I1 of the eye pattern monitoring device 121, and outputs the received data signal Data to the eye pattern monitoring device 121. A first output end of the CDR apparatus 110, i.e., a second output end O2 of the PD 111, is connected to the data aligning device 122, and outputs a local clock signal. A second output end of the CDR 110, i.e., a second output end of the VCO 114, is connected to a phase interpolator 123, and outputs the first set of scan clock signals CLKS1.

More specifically, the PD 111 compares phases of a local clock signal Φ-clk and the received data signal Data to obtain a phase difference, and generates a first control signal corresponding to the phase difference. For example, when the phase is behind, a UP signal is outputted to indicate that acceleration is needed; when the phase is ahead, a DN signal is outputted to indicate that deceleration is needed. Further, the first control signal is outputted via the first output end O1 to the CP 112. When the local clock signal Φ-clk is aligned with the phase of the received data signal Data, the local clock signal serving as the first clock signal is outputted via the second output O2 to the eye pattern measurement apparatus 120. More specifically, the PD may be a sequence circuit and a multiplication circuit. The sequence circuit is usually applied to a digital circuit, and is suitable for inputting square waves. The multiplication circuit multiplies the local clock signal Φ-clk by a waveform of the received data signal Data, and utilizes an average of the product as the first control signal that is then outputted to the CP 112.

The CP 112 converts the first control signal outputted by the PD 111 to a corresponding current signal.

The LPF 113 generates a second control signal VCTRL that matches the current signal outputted by the CP 112. More specifically, main functions of the LPF 113 are establishing a dynamic characteristic of a feedback control loop, providing the VCO 114 with an appropriate control signal, and eliminating interference noise of a front-end circuit. A parameter of the LPF 113 may be configured according to actual requirements, and the second control signal VCTRL outputted by the LPF 113 may be a voltage signal corresponding to a current signal outputted by the CP 112.

The VCO 114 adjusts the frequency of the local clock signal Φ-clk according to the second control signal VCTRL, and outputs the local clock signal Φ-clk via the first output end to the PD 111. More specifically, the VCO 114 may be a digital gate circuit type, an emitter-coupled multi-vibrator type, an LC oscillator type or a Schmidt circuit type. The outputted local clock signal Φ-clk is usually a square wave signal, but may also be a sawtooth wave, a triangular wave or a sine wave. The second control signal VCTRL outputted by the LPF 113 determines a starting oscillation frequency of the VCO 114. The VCO 114 converts the second control signal VCTRL to a corresponding phase, and adjusts the local clock signal Φ-clk according to the phase. The VCO 114 may adopt 2-times oversampling to output two local clock signals Φ-clk to the PD 111. One of the local clock signals Φ-clk is for scanning the center of the scan data signal, and the other is for scanning the edge of the data signal. The PD 111 determines whether the phase is ahead or behind through the relationship between the two local clock signals Φ-clk, and outputs the local clock signal Φ-clk for scanning the center of the data signal as the first clock signal I-clk when the phases of the local clock signal Φ-clk and the first clock signal I-clk are the same. Moreover, the VCO 114 further performs phase-shift on the recovered first clock signal to obtain the first set of scan clock signals CLKS1, and outputs the first set of scan clock signals CLKS1 to the eye pattern measurement apparatus 120.

It is understandable that, the CDR apparatus 110 is not limited to the above PLL circuit, and may be other known PLL circuit in the technical field, or any known circuit capable of implementing clock and data recovery in the technical field.

Figure 4:
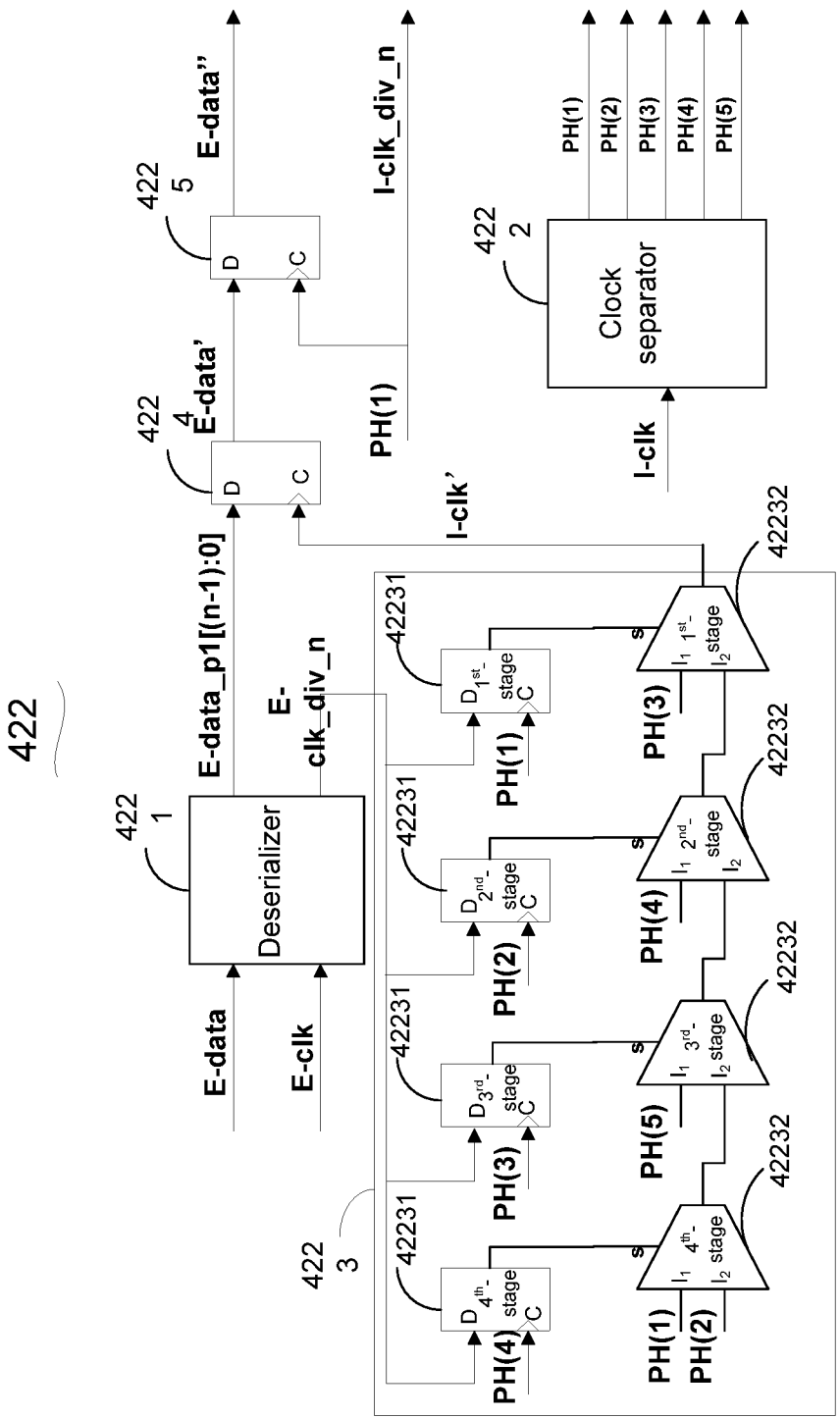
FIG. 4 is a schematic diagram of a data aligning device 422 in an eye pattern measurement apparatus according to an embodiment of the present invention.

FIG. 4 shows a schematic diagram of a data aligning device 422 in an eye pattern measurement apparatus according to an embodiment of the present invention. It is understandable that, the present invention may adopt other conventional circuit structures or software modules, or perform conventional replacement on the circuit shown in FIG. 4 to achieve the above functions of the data aligning device. Thus, any structures for achieving the above functions of the data aligning device are to be encompassed within the protection of the present invention.

In this embodiment, the data aligning device 422 includes a deserializer 4221, a clock separator 4222, a phase selector 4223, a first trigger 4224 and a third trigger 4225.

Figure 5:
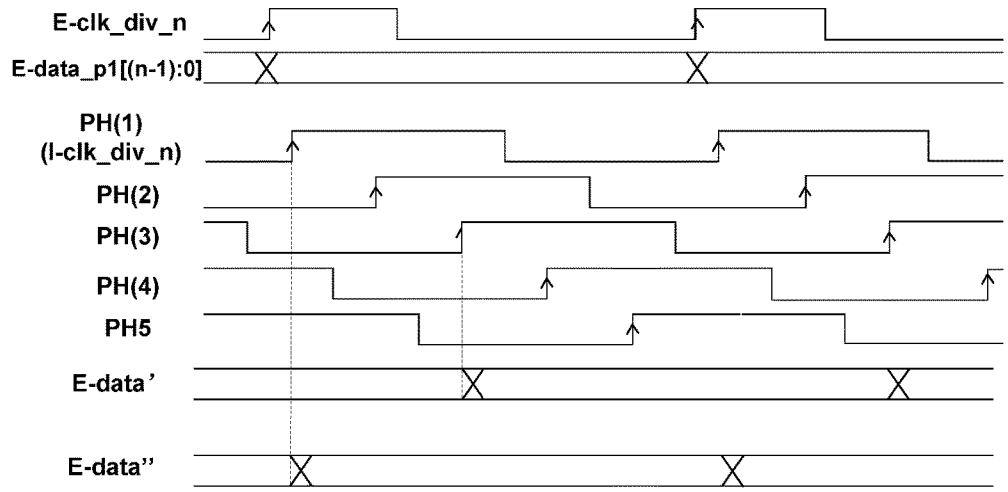
FIG. 5 is a waveform diagram of a part of clock signals and data signals adopted in an application scenario of the present invention.

An input end of the deserializer 4221 is connected to an eye pattern monitoring device of the eye pattern measurement apparatus, and receives the set of scan data signals E-data and the set of second clock signal E-clk, converts the set of serial scan data signals E-data to an n-bit parallel scan data signals E-data_pl[(n−1):0], and down-converts the clock frequency of the second clock signal E-clk received each time to 1/n of an original value to obtain a down-converted second clock signal E-clk_div_n. The clock frequency of the parallel scan data signals E-data$_{pl[(n}$−1):0] is 1/n of that of the serial scan data signals E-data, where n is a positive integer greater than 1, e.g., 40. FIG. 5 shows a waveform diagram of a part of clock signals and data signals adopted in an application scenario of the present invention. As shown in FIG. 5, the rising edge of the second clock signal E-clk_div_n is aligned with the center of the jump area of the scan data signal E-data_pl[(n−1):0]. More specifically, each time the eye pattern monitoring device performs sampling by using one of the first set of scan clock signals CLKS1 and obtains a scan data signal E-data, the eye pattern monitoring device outputs the scan data signal E-data and the corresponding second clock signal E-clk to the deserializer 4221. The deserializer 4221 performs serial-to-parallel conversion and down-conversion on the inputted signals to obtain the down-converted scan data signal E-data_pl[(n−1):0] and the second clock signal E-clk_div_n.

The clock separator 4222 receives the first clock signal I-clk outputted by the CDR apparatus 110. At this point, the clock separator 4222 down-converts the clock frequency of the first clock signal I-clk to 1/n of the original value, and performs different phase-shift processes on the down-converted first clock signal I-clk to obtain m third clock signals PH(1) to PH(m) having different phases, where m is a positive integer greater than 1, e.g., 4, 5, or 6. The phase difference between adjacent third clock signals PH(1) to PH(m) may be a predetermined phase difference, more specifically, 360/m°. The predetermined phase difference is normally greater than the circuit delay generated during the synchronization of the scan data signal by using the synchronization clock signal. As shown in FIG. 5, in one embodiment, m is 5, and the phases of the third clock signal PH(1) to the third signal PH(5) are 0°, 72°, 144°, 216° and 288°, respectively.

A first input end of the phase selector 4223 is connected to the deserializer 4221, and a second input end of the phase selector 4223 is connected to the clock separator 4222. The phase selector 4223 receives the second clock signal E-clk_div_n transmitted by the deserializer 4221 and the m third clock signals PH(1) to PH(m) generated by the clock separator 4222, and selects one of the third clock signals PH(1) to PH(m) according to the second clock signal E-clk_div_n. The phases of the selected signal and the second clock E-clk_div_n satisfy a setup/hold time requirement. The selected signal serves as the synchronization clock signal I-clk', and is used for synchronizing the scan data signal E-data_pl[(n−1):0].

In this embodiment, the phase selector 4223 may be, for example but not limited to, (m−1) stages of second triggers 42231 and (m−1) stages of selectors 42232.

The (m−1) stages second stages 42231 specifically include (m−1) second triggers 42231. More specifically, a data input end D of the second trigger 42231 at each stage serves as a first input end of the phase selector 4223, and is for inputting the second clock signal E-clk_div_n. A clock input end C of an $i^{th}$-stage second trigger 42231 serves as a second input end of the phase selector 4223, and is for inputting PH(i) of the third clock signals PH(1) to PH(m) outputted by the clock separator 4222, where i is a positive integer from 1 to (m−1). The phases of the third clock signals PH(1) to PH(m) have a sequential change, e.g., the phases sequentially increase/decrease. The $i^{th}$-stage second trigger 42231 is used for sampling the inputted second clock signal E-clk_div_n by using the third clock signal PH(i) and outputs a sample result. When a triggering edge (e.g., a rising edge) of the third clock signal PH(i) corresponds to a pulse section of the inputted second clock signal E-clk_div_n (the second clock signal of each period includes a low voltage level region and a high voltage level region, with the high and low voltage levels of the two regions being relative, and the pulse section is the high voltage level region in the second clock signal in one period), a first sample signal is outputted (e.g., outputting "1" representing a high voltage level signal), otherwise a second sample signal is outputted (e.g., outputting "0" representing a low voltage level signal).

The (m−1) stages of selectors 42232 specifically include (m−1) selectors 42232. A control end S of an $i^{th}$-stage second trigger 42232 is connected to an output end of the $i^{th}$-stage selector, a first input end I1 of the $i^{th}$-stage selector is for inputted a third clock signal PH((i+j)% m], and a second input end I2 of the $i^{th}$-stage selector is connected to an output end of the $(i+1)^{th}$-stage selector. An output end of the $1^{st}$-stage selector is connected to the clock input end C of the first trigger 4224, and the second input end I2 of the $(m−1)^{th}$ selector is for inputting the third clock signal PH(j). When the first sample signal is inputted at the control end S of the selector 42232 at each stage, the selector 42232 outputs the signal inputted at its first input end I1; when the second sample signal is inputted at the control end S of the selector 42232 at each stage, the selector 42232 outputs the signal inputted at its second input end I2.

The above expression (i+j)% m represents a remainder from dividing the sum of i and j by m. Wherein, i is a positive integer between 1 and (m−1), and j is a positive integer between 1 and (m−2). To ensure that the third clock signal PH selected by the data aligning device is at an open-eye area of the scan data signal E-data_pl([(n−1):0] but not in the jump area, the value j can be selected according to actual conditions, such that a sum of the maximum phase difference between the third clock signal PH[(i+j)% m] and the third clock signal PH(i) and the pulse width of the inputted second clock signal E-clk_div_n is smaller than the width of the window of the open eye of the scan data signal E-data_pl[(n−1):0]. For example, preferably, j may be set to be a positive integer between 2 and (m−2). For example, when m is 4, j is 3; when m is 5, j is 2 or 3; and when m is 6, j is 2, 3 or 4.

To ensure that, regardless of the value of the phase of the second clock signal E-clk_div_n, the second trigger 42231 can detect the phase information of the second clock signal E-clk_div_n, to further ensure that the selector 42232 is capable of correctly selecting the corresponding third clock signal PH(i), the pulse width (i.e., the width of the pulse section) of the second clock signal E-clk_div_n inputted to the phase selector 4223 needs to be greater than the phase differences of all adjacent third clock signals PH(i). Further, the pulse width of the second clock signal E-clk_div_n may be limited to be smaller than the phase difference of any two adjacent second clock signals E-clk_div_n.

In one embodiment, a phase differences θ between the adjacent third clock signals PH(1) to PH(m) are equal, and a pulse width t of the second clock signal E-clk_div_n may be set as θ<t≤1.5θ. For example, when m is 4, the phases of the third clock signals PH(1) to PH(m) are sequentially 0°, 90°, 180° and 270°. At this point, the working period of second clock signal is greater than 25% and smaller than or equal to 37.5%, e.g., 30%, 35% or 37.5%. When m is 5, the phases of the third clock signals PH(1) to PH(m) are sequentially 0°, 72°, 144°, 216° and 288°. At this point, the working period of the second clock signal is greater than 20% and smaller than or equal to 30%, e.g., 25% or 30%. When m is 6, the phases of the third clock signals PH(1) to PH(m) are sequentially 0°, 60°, 120°, 180°, 240° and 300°. At this point, the working period of the second clock signal is greater than or equal to 17% and smaller than or equal to 25%, e.g., 20% or 25%.

Figure 6:
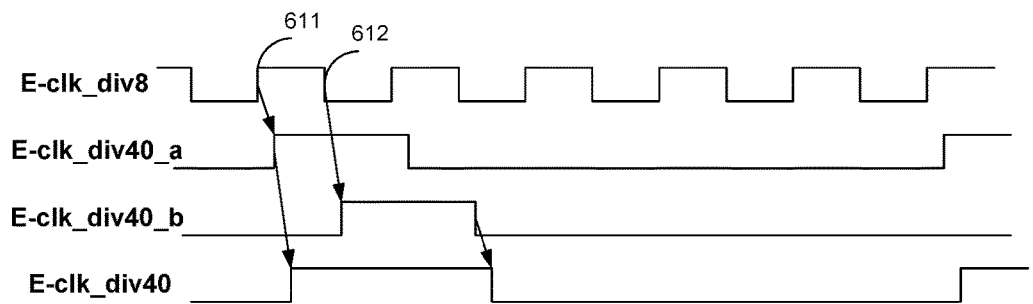
FIG. 6 is a waveform diagram of a second clock signal obtaining a working period in another application scenario of the present invention.

The working period of the second clock signal E-clk_div_n may be realized and configured by a device, such as a deserializer or an eye pattern monitoring device, that inputs the second clock signal E-clk_div_n to the phase selector 4223. FIG. 6 shows a waveform diagram of a second clock signal obtaining an operating period in another application scenario of the present invention. An example is given with reference to FIG. 6, and it is assumed that n is 40. The deserializer 4221 divides the second clock signal E-clk by 8 to obtain a second clock signal E-clk_div8. At a rising edge 611, the second clock signal E-clk_div8 is divided by 5 to obtain a second clock signal E-clk_div40_a. The working period of the second clock signal E-clk_div40_a is 20%. At the falling edge, the second clock signal E-clk_div40_a is again sampled to obtain a second clock signal E-clk_div40_b. An OR operation is performed on the clock signal E-clk_div40_a and the clock signal E-clk_div40_b to generate a second clock signal E-clk_div40 having a 30% working period.

Through the above structure of the phase selector 4223, when the rising edge of a third clock signal PH(i) falls at the pulse section of the second clock signal E-clk_div_n, it can be deemed that the third clock signal PH(i) is close to the rising edge of the second clock signal E-clk_div_n. Because the rising edge of the second clock signal E-clk_div_n is aligned with the jump area of the scan data signal E-data_pl [(n−1):0], it can be deemed that the third clock signal PH(i) is close to the jump area of the scan data signal E-data_pl [(n−1):0]. Thus, selecting another third clock signal PH[(i+j)% m], having a predetermined phase difference from PH(i), as the synchronization clock signal I-clk' ensures that the rising edge is aligned with the window of an open eye of the scan data signal E-data_pl[(n−1):0]. It is further ensured that the back-end first trigger 4224 for synchronizing the scan data signal E-data_pl[(n−1):0] is capable of correctly synchronizing data, preventing synchronization data errors.

After the above process, the phase selector 4223 outputs the synchronization signal I-clk' to the first trigger 4224 to synchronize the scan data signal E-data_pl[(n−1):0].

The data input end D of the first trigger 4224 is connected to the deserializer 4221, and the clock input end C is connected to the phase selector 4223. The first trigger 4224 performs second sampling on the scan data signal E-data_pl [(n−1):0] inputted at the data input end by using the synchronization clock signal I-clk' to obtain E-data' that is synchronous with the synchronization signal I-clk'. The second sampling is completing the alignment between the synchronization clock signal I-clk' and the scan data signal E-data_pl[(n−1):0]. Thus, due to the presence of circuit delay, the jump area of the synchronized scan data signal E-data' occurs later than a triggering edge (e.g., a rising edge) of the synchronization clock signal I-clk'. Since the selected synchronization clock signal I-clk' satisfies the setup/hold time requirement of the current synchronized data scan signal E-data' and the first clock signal I-clk, synchronization of the first cock signal I-clk and the scan data signal E-data' can be performed in a back-end circuit without causing any synchronization data errors.

It is understandable that, in this embodiment, because back-end circuits do not demand high speeds, the data aligning device may convert high-seed serial data signals to low-speed parallel data signals for subsequent processing. However, in another embodiment, the data aligning device may exclude the above deserializer. That is, the first input end of the phase selector is directly connected to the eye pattern monitoring device, the second clock signal E-clk outputted by the eye pattern monitoring device is not down-converted and is directly inputted into the phase selector, the clock separator does not down-convert the first clock signal I-clk and directly outputs multiple third clock signals PH(1) to PH(m) having different phases obtained from performing phase-shift on the first clock signal I-clk to the phase selector, and the phase collector performs the above process according to the input signal to obtain the synchronization clock signal. The data input end of the first trigger 4224 is directly connected to the eye pattern monitoring device to synchronize the scan data signal outputted by the eye pattern monitoring device with the synchronization clock signal.

It should be noted that, the first trigger 4224 implements only the synchronization between the scan data signal E-data and the synchronization clock signal I-clk' generated from performing phase-shift on the a first clock signal I-clk, and in fact does not implement the synchronization between the scan data signal E-data and the first clock signal I-clk. Thus, the above example may serve as an optional embodiment. The data aligning device 422 further implements real synchronization between the scan data signal E-data' and the first clock signal I-clk. For example, the data aligning device 422 further includes a third trigger 4225. A data input end D of the third trigger 4225 is connected to an output end of the first trigger 4224, and a clock input end C of the third trigger 4225 is for inputting a third clock signal PH(a) serving as a new first clock signal I-clk having a 0° phase difference, where a may be any value between 1 to m, such as the third clock signal PH(1) in the above embodiment. The third trigger 4225 is further used to again sample the scan data signal E-data' by using the third clock signal PH(a) to output a scan data signal E-data" synchronous with the third clock signal PH(a). As such, due to the presence of circuit delay, the jump area of the again sample scan data signal E-data"

occurs later than the triggering edge of the third clock signal PH(a), achieving the synchronization between the scan data signal E-data and the first clock signal I-clk. Further, because the synchronization clock signal E-clk' adopted by the first trigger 4224 already satisfies the setup/hold time requirement of the currently synchronized scan data signal E-data' and first clock signal I-clk, synchronization of the first cock signal and the scan data signal can be performed without causing any synchronization data errors.

In yet another embodiment, the data aligning device 422 may be used to further output the first clock signal I-clk. In an embodiment where the data aligning device 422 is not provided with the third trigger 4225 and the deserializer 4221, the data aligning device 422 may directly output the first clock signal I-clk inputted to the data aligning device 422. In an embodiment where the data aligning device 422 is not provided with the third trigger but provided with a deserializer, the data aligning device 422 utilizes a third clock signal PH(a) down-converted by the clock separator 4222 as the first clock signal I-clk_div_n that is then outputted; for example, the third clock signal PH(1) having a 0° phase difference from the non-down-converted first clock signal I-clk is selected. In an embodiment where the data aligning device 422 is not provide with the third trigger, the data aligning device 422 utilizes the third clock signal PH(a) inputted to the clock input end of the third trigger as a down-converted first clock signal I-clk_div_n that is then outputted; for example, the third clock signal PH(1) having a 0° phase difference from the non-down-converted first clock signal I-clk is selected.

In the description below, an example of data changes during the process performed by the eye pattern measurement apparatus is given with reference to FIG. 5. The eye pattern monitoring device scans a data signal Data by using the first set of scan clock signals CLKS1 to obtain a scan data signal E-data, and outputs the scan data signal E-data and the second clock signal E-clk synchronized with the scan data signal E-data to a data aligning device. The data aligning device converts the scan data signal E-data to n-bit parallel scan data signals E-data_P1[(n−1):0] and a down-converted E-clk_div_n, from which the data aligning device selects the third clock signal PH(3) satisfying the above setup/hold time requirement to synchronize the scan data signal E-data_P1[(n−1):0] to obtain a scan data signal E-data' aligned with PH(3). The data aligning device further synchronizes the scan data signal E-data' by using the third clock signal PH(3) to obtain a scan data signal E-data" aligned with PH(1), and outputs the third clock signal PH(1) having the same phase as the first clock signal I-clk as the new first clock signal I-clk_div_n. A back-end circuit may determine whether the phase of the corresponding scan clock signal is a good or bad phase through determining whether the outputted scan data signal is correct for E-data, so as to further determine the eye quality.

Figure 7:
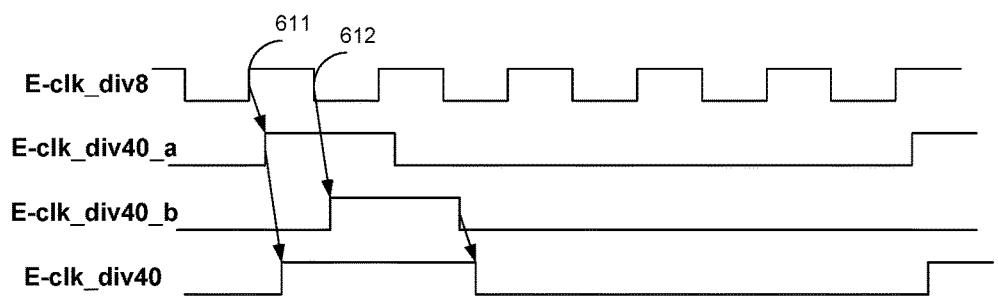
FIG. 7 is a waveform diagram of a part of clock signals and data signals adopted in yet another application scenario of the present invention.

FIG. 7 shows a waveform diagram of a part of clock signals and data signals adopted and obtained in another application scenario of the present invention. As shown in FIG. 7, in an embodiment where n is 40, the received data signal Data is a serial data signal, and a first clock signal I-clk synchronous with the data signal Data is extracted therefrom. The eye pattern monitoring device scans and obtains a scan data signal E-data and a second clock signal E-clk synchronous with the scan data signal E-data. The data aligning device performs serial-to-parallel conversion on the scan data signal E-data to 40-bits parallel scan data signals E-data_P1[39:0], synchronizes the 40-bits parallel scan data signals E-data_P1[39:0] by using one of third clock signals PH(1) to PH(m) to obtain a scan data signal E-data', synchronizes the scan data signal E-data' by using the third clock signal PH(1) to obtained a scan data signal E-data" aligned with PH(1), and outputs the third clock signal PH(1) having a same phase as the first clock signal I-clk as the new first clock signal I-clk_div_40.

It is understandable that, the units included in the data aligning device are functionally divided. In practice, the units may be integrated in one or multiple circuits, or at least a part of the units are implemented by a software program operated by the data aligning device. The present invention does not limit the type of the software program.

To better understand the task of the phase selector of the data aligning device, an example is given with reference to FIG. 4 and FIG. 5 below. In this example, m is 5, j is 2, the working period of the second clock signal E-clk_div_n inputted to the phase selector 4223 is 30%, the third clock signals PH(1) to PH(5) have fixed phase differences, and a phase relationship between the currently inputted second clock signal E-clk_div_n and the third clock signals PH(1) to PH(m) is as shown in FIG. 5. Referring to FIG. 4, at this point, the 1$^{st}$-stage trigger 42231 outputs a first sampling signal ("1"); the 1$^{st}$-stage selector 42232 further outputs the third clock signal PH(3) of the first input end, and so the third clock signal PH(3) is selected to perform the above second sampling on the scan data signal E-data_pl[(n−1):0]. Because at the same positions, the phases of the third clock signal PH(3) and the second clock signal E-clk_div_n do not include rising edges, sufficient setup/hold time during the sampling of the scan data signal E-data_pl[(n−1):0] by using the third clock signal PH(3) is ensured. After the first trigger 4224 aligns the scan data signal E-data_pl[(n−1):0] with one of the third clock signals, due to the presence of a fixed phase difference among the third clock signals, the phase relationship between any two of the three third clock signals satisfies the setup/hold time requirement. Thus, the third trigger 4225 again samples the result E-data' of the first trigger 4224 through PH(1) to obtain a scan data signal E-data" aligned with the current first clock signal I-clk_div_n (PH1).

In an example where m is 5 and the working period of the second clock signal E-clk_div_n is 30%, when the phase of the second clock signal E-clk_div_n inputted to the phase selector 4223 is close to the that of the third clock signal PH(1), and the second clock signal E-clk_div_n is sampled by using different third clock signals PH(1) to PH(m), following cases exist (wherein, the first sample signal obtained is a high voltage level signal represented as "1" when the rising edge of the third clock signal corresponds to a pulse section of the second clock signal, otherwise the second sample signal obtained is a low voltage level signal represented as "0"):

|       | PH(1) | PH(2) | PH(3) | PH(4) | PH(5) |
|-------|-------|-------|-------|-------|-------|
| Case1 | 1     | 1     | 0     | 0     | 0     |
| Case2 | 1     | 0     | 0     | 0     | 0     |
| Case3 | 1     | 0     | 0     | 0     | 1     |

In the above cases 1 to 3, the rising edge of the second clocks signal E-clk_div_n is between the third clock signals PH(5) and PH(2). At this point, by sampling the scan data signal E-data_pl[(n−1):0] by using PH(3), at least 1/5 period of the first clock signal is used for the setup/hold time. Similarly, if the rising edge of the second clock signal E-clk_div_n is between PH(1) and PH(3), the third clock signal PH(4) is used to sample the scan data signal E-data_pl[(n−1):0].

Similarly, in an example where m is 4 and the working period of the second clock signal E-clk_div_n is 37.5%, when the phase of the second clock signal E-clk_div_n inputted to the phase selector 4223 is close to the third clock signal PH(1), and the second clock signal E-clk_div_n is sampled by using different third clock signals PH(1) to PH(m), following cases exist:

|  | PH(1) | PH(2) | PH(3) | PH(4) |
|---|---|---|---|---|
| Case1 | 1 | 1 | 0 | 0 |
| Case2 | 1 | 0 | 0 | 0 |
| Case3 | 1 | 0 | 0 | 1 |

In the above cases 1 to 3, the rising edge of the second clock signal E-clk_div_n is between the third clock signals PH(4) and PH(2). At this point, the third clock signal PH(1) or PH(2) may be used to sample the scan data signal E-data_pl[(n−1):0].

Similarly, in an example where m is 6 and the working period of the second clock signal E-clk_div_n is 25%, when the phase of the second clock signal E-clk_div_n inputted to the phase selector 4223 is close to that of the third clock signal PH(1), and the second clock signal E-clk_div_n is sampled by using different third clock signals PH(1) to PH(6), following cases exist:

|  | PH(1) | PH(2) | PH(3) | PH(4) | PH(5) | PH(6) |
|---|---|---|---|---|---|---|
| Case1 | 1 | 1 | 0 | 0 | 0 | 0 |
| Case2 | 1 | 0 | 0 | 0 | 0 | 0 |
| Case3 | 1 | 0 | 0 | 0 | 0 | 1 |

In the above cases 1 to 3, the rising edge of the second clock signal E-clk_div_n is between the third clock signals PH(6) and PH(2). At this point, the third clock signal PH(3) or PH(4) may be used to sample the scan data signal E-data_pl[(n−1):0].

It is known from the above regularity that, the third clock signal PH[(i+j)% m] can be selected to sample the scan data signal, where j is any positive integer between 1 and (m−2), preferably a positive integer between 2 and (m−2).

Figure 8:
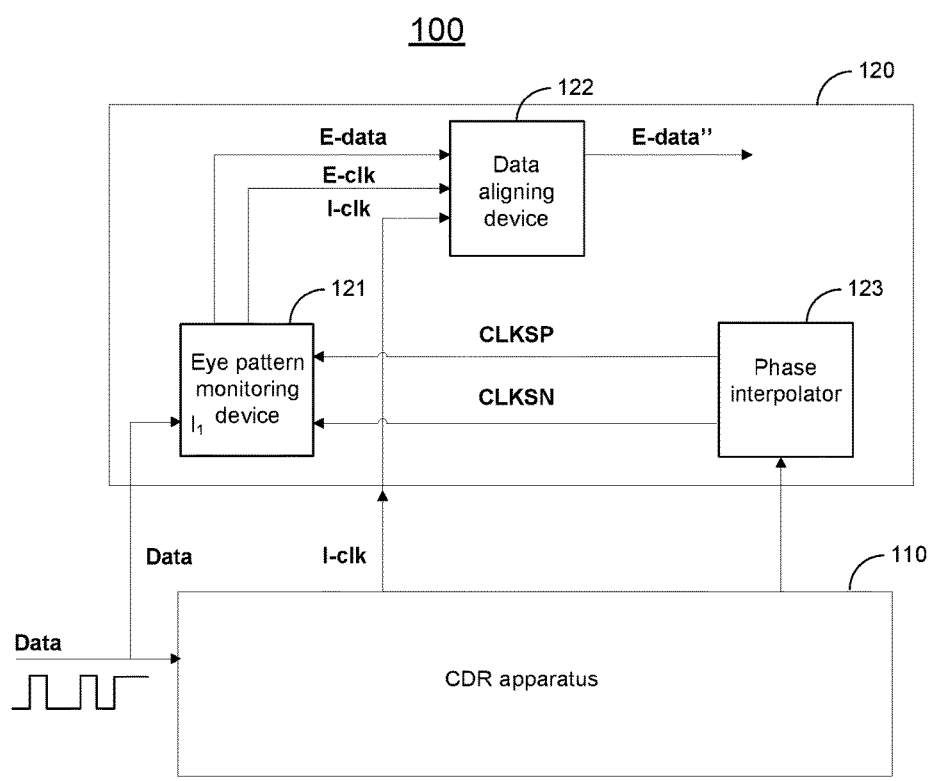
FIG. 8 is a schematic diagram of a CDR system according to another embodiment of the present invention.

FIG. 8 shows a schematic diagram of a CDR system according to another embodiment of the present invention. In another embodiment, the eye pattern monitoring apparatus 120 in the CDR system further includes a phase interpolator 123. The phase interpolator 123, connected between the CDR apparatus 110 and the eye monitoring device 121, receives the first set of scan clock signals CLKS1, generates two oppositely phased scan clock signals and transmits the same to the above eye pattern monitoring device 121. The phase interpolator 123 may also be referred to as a phase DAC. For example, assuming that the first set of scan clock signals CLKS1 have a first phase difference, the phase interpolator 123 interpolates the first set of scan clock signals CLKS1 to obtain a second set of scan clock signals that have a second phase difference. The first phase difference is greater than the second phase difference. The phase interpolator 123 further sequentially outputs a scan clock signal CLKSP and a scan clock signal CLKSN selected from the second set of scan clock signals each time to the eye pattern monitoring device 121 until all of the second set of scan clock signals are transmitted to the eye pattern monitoring device 121. The scan clock signal CLKSP and the scan clock signal CLKSN transmitted each time have opposite phases.

The interpolator 123 divides the first set of scan clock signals CLKS1 to a second scan clock signals having an even smaller phase difference. The first set of scan clock signals CLKS1 have 8 phases, i.e., the phases of the first set of scan clock signals are 0°, 45°, 90° . . . and 315°, with the phase difference between adjacent scan clock signals in the first set of scan clock signals being 45°. The first set of scan clock signals CLKS1 are further divided into the second set of scan clock signals having 64 phases, i.e., the phase of the second set of scan clock signals are 0°, 5.625°, 11.25° . . . and 354.375°, with the phase difference between adjacent scan clock signals in the second set of scan clock signals being 5.625°. the phase interpolator 123 sequentially outputs two divided oppositely phased scan clock signals CLKSP and CLKSN to the eye pattern monitoring device 121. For example, the phase interpolator 123 sequentially outputs the scan clock signals CLKSP and CLKSN respectively having phases of 0° and 180°, 5.625° and 185.625°, 11.25° and 191.25°, and so forth, until the scan clock signals CLKSP and CLKSN respectively having phases of 354.375° and 174.375° are outputted. In the present invention, two scan clock signals CLKSP and CLKSN are given as an example for illustration purposes. However, one person skilled in the art can understand that, the phase interpolator 123 may output 1, 4, 8 or even more scan clock signals for the eye pattern monitoring device 121 to use based on requirements.

Each time the eye pattern monitoring device 121 receives the scan clock signal CLKSP and the scan clock signal CLKSN, the eye pattern monitoring device 121 performs the first sampling individually on the received scan clock signal CLKSP and scan clock signal CLKSN, and obtains a set of scan data signals E-data from first sample results, and generates a buffer clock of the scan clock signal CLKSP as the second clock signal E-clk synchronous to the corresponding scan data signal E-data. The buffer clock and the scan clock signal CLKSP have the same frequency but a phase difference. After having received all of the scan clock signals inputted by the phase interpolator 123, the eye pattern monitoring device 121 generates the above set of scan data signals E-data and the set of second clock signals E-clk.

In conclusion, the phase interpolator 123 is not an essential element of the eye pattern measurement apparatus 120. That is to say, the second set of scan clock signals are not limited to being generated by the phase interpolator 123, and may be generated by a circuit capable of sequentially outputting differently phased clocks, or be directly replaced by the first set of scan clock signals CLKS1. Further, the CDR apparatus 110 does not necessarily generate and output the first set of scan clock signals CLKS1, and may directly output the first clock signal; the second set of scan clock signals may be directly generated according to the first clock signal by a circuit similar to the interpolator 123 in the eye pattern measurement apparatus 120.

It is understandable that, the above eye pattern measurement apparatus may be applied to any circuit system that needs to measure the eye quality of data signals, and is not limited to being applied in the above CDR system.

Figure 9:
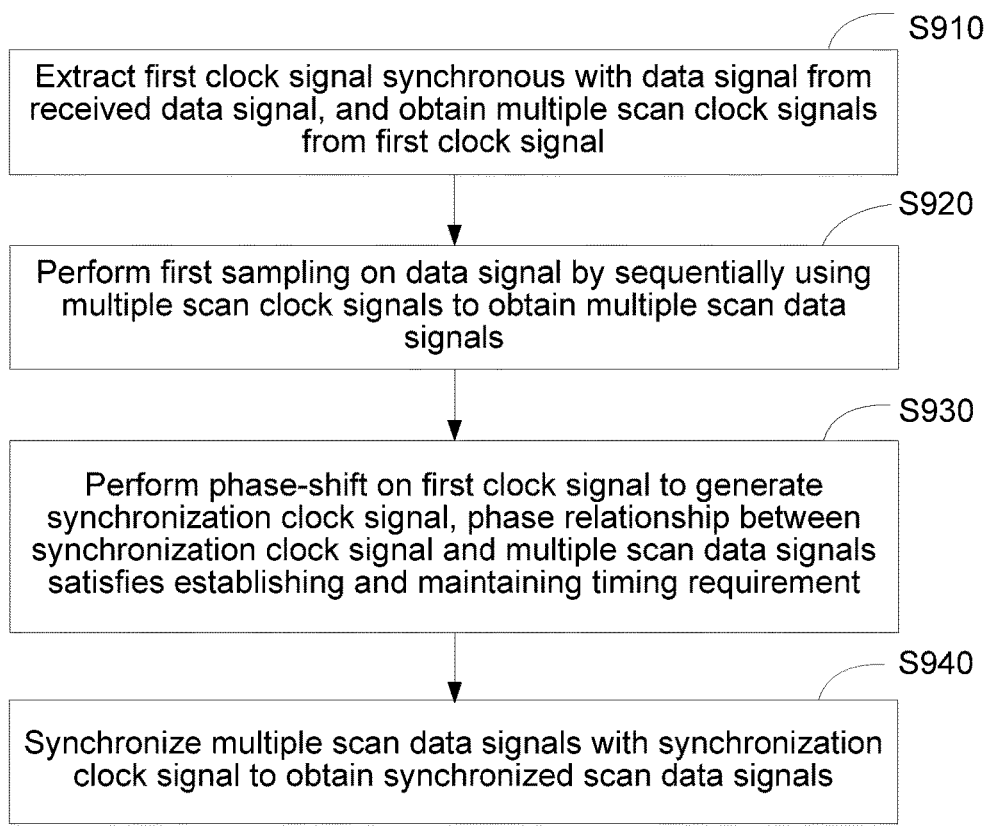
FIG. 9 is a flowchart of a data signal processing method according to an embodiment of the present invention.

FIG. 9 shows a flowchart of a data signal processing method according to an embodiment of the present invention. In this embodiment, the method may be performed by the above data aligning device or CDR system, and includes following steps.

In step S910, a first clock signal synchronous with a received data signal is extracted from the data signal, and phase-shift is performed on the first clock signal to obtain multiple scan clock signals.

In step S920, first sampling is performed on the data signal by sequentially using the multiple scan clock signals to obtain multiple scan data signals.

The periods of the multiple scan clock signals are equal to the period of the first clock signal, and the multiple scan clock signals have different phases.

In step S930, phase-shift is performed on the first clock signal to generate a synchronization clock signal. A phase relationship between the phase of the synchronization clock signal and the phases of the multiple scan data signals satisfy a setup/hold time requirement.

In step S940, the multiple scan data signals and the synchronization signal are synchronized to obtain synchronized scan data signals. The phase of the synchronization clock signal further satisfies a condition that, a phase relationship between the synchronized scan data signals and the first clock signal further satisfies the setup/hold time requirement.

For example, a predetermined phase difference is present between the synchronization clock signal and the first clock signal, and the phase difference between the synchronization clock signal and the multiple scan data signals is greater than the predetermined phase difference.

Selectively, step S910 include sub-steps of: comparing phases of a local clock signal and the received data signal to obtain a phase difference, and generating a first control signal corresponding to the phase difference; and when the phases of the local clock signal and the received data signal are aligned, utilizing the local clock signal as the first clock signal; converting the first control signal to a corresponding current signal; generating a second control signal that matches the current signal outputted by a charge pump; and adjusting the frequency of the local clock signal according to the second control signal to obtain the local clock signal, and repeating the above sub-steps.

Selectively, step S930 includes following sub-steps.

In step S931, phase-shift is performed on the first clock signal to obtain m third clock signals having different phases. The phases of the m third clock signals satisfies a condition that, a phase relationship between the data signals synchronized by the third clock signals and the first clock signal satisfies the setup/hold time requirement, where m is a positive integer greater than 1.

In step S932, from m third clock signals, a third clock signal having a phase relationship, with the second clock signal, that satisfies a setup/hold time requirement is selected as the synchronization clock signal.

In step S933, second sampling is performed on the multiple scan data signals by using the synchronization clock signal to obtain the multiple scan data signals synchronous with the synchronization clock signal.

Further, before step S931, step S930 further includes a sub-step S934. In step S934, the serial scan data signals are converted to n bits of parallel scan data signals, and the clock frequency of the second clock signal is down-converted to 1/n to an original value. The clock frequency of the multiple parallel scan data signals is 1/n of that of the serial scan data signals, where n is a positive integer greater than 1. The scan data signals and the second clock signal processed in step S932 and step S933 are signals processed (serialized and down-converted) in step S934. Step S931 specifically includes down-converting the clock frequency of the first clock signal to 1/n of the original value, and performing different phase-shift processes on the first clock signal to obtain m third clock signals having different phases.

Further, in step S931, m third clock signals PH(1) to PH(m) having sequentially changing phases are generated.

Step S932 includes: sampling the inputted second clock signal by sequentially using the (m−1) third clock signals PH(1) to PH(m) to obtain sample results; when the triggering edge of the third clock signal corresponds to a pulse section of the inputted second clock signal, outputting a first sample signal, otherwise outputting a second sample clock signal; when the sample results include the outputted first sample signal, selecting the third clock signal PH[(i+j)% m] associated with the third clock signal PH(i) that generates the first sample result as the synchronization clock signal; when the sample results do not include outputted first sample result, selecting the third clock signal PH(s) as the synchronization clock signal. Wherein, s is a smallest sequence number of the third clock signal for generating the first sample signal (e.g., assuming that the third clock signals of a sample signal is PH(1) to PH(3), s is 1), i is a positive integer from 1 to (m−1), and j is a positive integer from 1 and (m−2).

The pulse width of the second clock signal is greater than the phase difference between any two adjacent third clock signals, and a sum of a maximum phase difference between the third clock signal PH[(i+j)% m] and the third clock signal PH(i) and the pulse width of the second clock signal is smaller than a width of a window of an open eye of the scan data signal.

In one application, the phase differences of adjacent third clock signals are equal. When m is 6, the working period of the second clock signal is greater than or equal to 17%, and smaller than or equal to 25%; when m is 5, the working period of the second clock signal is greater than 20%, and smaller than or equal to 30%; when m is 4, the working period of the second clock signal is greater than 25%, and smaller than or equal to 37.5%.

Selectively, after step S933, step S930 further includes a sub-step S935. In step S935, second sampling is performed on the scan data signal obtained in step S933 by using a third clock signal serving as the first clock signal to obtain a scan data signal synchronous with the third clock signal.

Selectively, step S930 further includes a sub-step S936. In step S936, the first clock signal is outputted.

Further, step S936 includes: utilizing the third clock signal serving as the first clock signal as a new first clock signal, and outputting the new first clock signal. The third clock signal having a 0° phase difference from the original first clock signal may be used as the new first clock signal.

Selectively, before step S932, step S930 further includes a sub-step S937. In step S937, at least two fourth clock signals, which are generated from performing phase-shift on the first clock signal and have a first phase difference, are interpolated to obtain multiple scan clock signals having a second phase difference, and multiple sets of scan clock signals CLKSP and scan clock signals CLKSN having an opposite phase from the scan clock signals CLKSP are obtained. In the present invention, only two scan clock signals CLKPS and CLKPN are given as an example. One person skilled in the art can understand that, the phase interpolator 123 may output 1, 4, 8 or even more scan clock signals for subsequent use.

Step S932 includes: performing the first sampling on the data signal by sequentially using the set of scan clock signals CLKSP and CLKSN obtained in step S937 to obtain the scan data signals; and generating a buffer clock of the scan clock signal CLKPS synchronous with the scan data signal as the second clock signal, wherein the first phase difference is greater than the second phase difference.

In the above solution, the scan data signal representing eye quality is obtained by scanning the data signal, first phase-shift is performed on the first clock signal to obtain a synchronization clock signal that enables a phase relationship between a first clock signal and scan data signals to satisfy a setup/hold time requirement, and the synchronization clock signal can be accordingly used to sample the scan data signals to achieve synchronization, thereby realizing the measurement of an eye pattern. Further, because the synchronization clock signal does not sample jump areas of the scan data signals obtained from eye pattern measurement, the current process of synchronization does not cause data errors. Meanwhile, as the synchronized scan data signals and the first clock signal satisfy the setup/hold time requirement, the subsequently synchronization of the synchronized scan data signals with the first clock signal is also free from data errors.

In the above description, for illustration but not limitation, details of specific system structures, interfaces and techniques are given to better understand the present invention. However, one person skilled in the art can understand that, without these details, the present invention can be implemented in other embodiments. In other circumstances, details on the generally known devices, circuits and methods are omitted to prevent unnecessary details from obstructing the description of the present invention.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An eye pattern measurement apparatus, comprising:
    an eye pattern monitoring device, performing first sampling on a data signal by sequentially using a plurality of scan clock signals having different phases to obtain a plurality of scan data signals, wherein a period of the plurality of scan clock signals is equal to a period of a first clock signal synchronous with the data signal; and
    a data aligning device, connected to the eye pattern monitoring device, receiving the plurality of scan data signals outputted by the eye pattern monitoring device, performing phase-shift on the first clock signal to generate a synchronization clock signal having a phase relationship, with the plurality of scan data signals, that satisfies a setup/hold time requirement, synchronizing the plurality of scan data signals with the synchronization clock signal, and outputting a plurality of synchronized scan data signals;
    wherein, a phase of the synchronization clock signal further satisfies a condition that, a phase relationship between the plurality of scan data signals synchronized by the synchronization and the first clock signal further satisfies a setup/hold time requirement.

2. The eye pattern measurement apparatus according to claim 1, wherein the eye pattern monitoring device further outputs a second clock signal synchronous with the plurality of scan data signals; and the data aligning device comprises:
    a clock separator, performing different phase-shift processes on the first clock signal to generate m third clock signals having different phases; wherein, a phase of the m third clock signals satisfies a condition that, a phase relationship between the data signal synchronized by the plurality of third clock signals and the first clock signal satisfies the setup/hold time requirement, where m is a positive integer greater than 1;
    a phase selector, connected to the clock separator and the eye pattern monitoring device, selecting, from the m third clock signals, one of the plurality of third clock signals having a phase relationship, with the second clock signal, that satisfies the setup/hold time requirement, as the synchronization clock signal; and
    a first trigger, having a data input end thereof connected to the eye pattern monitoring device and a clock input end thereof connected to the phase selector, performing second sampling on the plurality of scan data signals inputted to the data input end by using the synchronization clock signal to obtain the plurality of scan data signals synchronous with the synchronization clock signal.

3. The eye pattern measurement apparatus according to claim 1, wherein:
    the data aligning device further comprises a deserializer connected to the eye pattern monitoring device;
    the deserializer converts the plurality of serial scan data signals outputted by the eye pattern monitoring device to a plurality of n-bit parallel scan data signals, and down-converts a clock frequency of the second clock signal outputted by the eye pattern monitoring device to 1/n of an original value, wherein a clock frequency of the plurality of parallel scan data signals is 1/n of that of the plurality of serial scan data signals, and n is a positive integer greater than 1; the clock;
    the clock separator down-converts a clock frequency of the first clock signal to 1/n of an original value, and performs different phase-shift processes on the down-converted first clock signal to obtain m third clock signals having different phases;
    the phase selector is connected to the eye pattern monitoring device via the deserializer, and the second clock signal inputted therein is the down-converted second clock signal; and
    the data input end of the first trigger is connected to the eye pattern monitoring device via the deserializer, and the plurality scan data signals inputted to the data input end are the plurality of scan data signals having been converted by the deserializer.

4. The eye pattern measurement apparatus according to claim 2, wherein the clock separator generates the m third clock signals PH(1) to PH(m) having sequentially changing phases; and the phase selector comprises:
    (m−1) stages of second triggers; wherein, the data input end is for inputting the second clock signal, the clock input end of the $i^{th}$-stage second trigger is for inputting the third clock signal PH(i), the $i^{th}$-stage second trigger samples the inputted second clock signal by using the third clock signal PH(i) to output a sample result, and a first sample signal is outputted when a triggering edge of the third clock signals corresponds to a pulse section of the inputted second clock signal, otherwise a second sample signal is outputted; and
    (m−1) selectors; wherein, the $i^{th}$-stage selector has a control end thereof connected to an output end of the $i^{th}$-stage second trigger, a first input end thereof for inputting the third clock signal PH[(i+j)% m], and a second input end thereof connected to the $(i+1)^{th}$-stage output end, the output end of the $1^{st}$-stage selector is connected to the clock input end of the first trigger, the second input end of the $(m-1)^{th}$ stage selector is for inputting the third clock signal PH(j), and the selector outputs a signal inputted at the first input end when the control end inputs the first sample signal, and outputs a signal inputted at the second input end when the control end outputs the second sample signal;

wherein, i is a positive from 1 and (m−1), and j is a positive integer from 1 to (m−2).

5. The eye pattern measurement apparatus according to claim 4, wherein a pulse width of the second clock signal inputted to the phase selector is greater than a phase difference between any adjacent third clock signals; and a sum of a maximum phase difference between the third clock signal PH(i+j)%m) and the third clock signal PH(i) and the pulse width of the second clock signal is smaller than a width of a window of an open eye of the plurality of scan data signals.

6. The eye pattern measurement apparatus according to claim 5, wherein:

phase differences of adjacent of the plurality of third clock signals are equal;

when m is 6, a working period of the second clock signal inputted to the phase selector is greater than or equal to 17%, and smaller than or equal to 25%;

when m is 5, the working period of the second clock signal inputted to the phase selector is greater than 20%, and smaller than or equal to 30%; and when m is 4, the working period of the second clock signal inputted to the phase selector is greater than 25%, and smaller than or equal to 37.5%.

7. The eye pattern measurement apparatus according to claim 2, wherein the data aligning device further comprises:

a third trigger, having a data input end thereof connected to the output end of the first trigger, a clock input end for inputting a third clock signal used as the first clock signal, performing second sampling on the plurality of scan data signals inputted to the data input end by using the third clock signal inputted to the clock input end, and outputting the plurality of scan data signals synchronous with the third clock signal inputted to the clock input end; and a phase relationship between the third clock signal inputted to the clock input end of the third trigger and the synchronization clock signal satisfies the setup/hold time requirement.

8. The eye pattern measurement apparatus according to claim 7, wherein the data aligning device further outputs the first clock signal.

9. The eye pattern measurement apparatus according to claim 8, wherein the data aligning device utilizes the third clock signal inputted to the clock input end of the third trigger as a new first clock signal, and outputs the new first clock signal.

10. The eye pattern measurement apparatus according to claim 1, further comprising:

a phase interpolator, connected to the eye pattern monitoring device, interpolating at least two fourth clock signals, which are generated from performing phase-shift on the first clock signal and have a first phase difference, to obtain the plurality of scan clock signals having a second phase difference, and according to a timing, outputting the plurality of scan clock signals CLKSP having different phases and outputting the plurality of scan clock signals CLKSN having opposite phases from the plurality of scan clock signals CLKSP;

wherein, the eye pattern monitoring device performs the first sampling on the data signal by individually using the plurality of scan clock signals CLKSP and the plurality of scan clock signals CLKSN received each time to obtain the plurality of scan data signals, and generates a buffer clock of the plurality of scan clock signals CLKSP of the plurality of scan clock signals as the corresponding second clock signal; and the first phase difference is greater than the second phase difference.

11. The eye pattern measurement apparatus according to claim 1, wherein the synchronization clock signal and the first clock signal have a predetermined phase difference, and a phase difference between the plurality of scan data signals is greater than the predetermined difference.

12. A clock and data recovery system, comprising:

a clock and data recovery apparatus, extracting a first clock signal synchronous with a received data signal from the data signal, and outputting the first clock signal and the data signal; and the eye pattern measurement apparatus of claims 1, connected to the clock and data recovery apparatus.

13. The clock and data recovery system according to claim 12, wherein the clock and data recovery apparatus comprises:

a phase detector, comparing phases of a local clock signal and the data signal to obtain a phase difference, and generating a first control signal corresponding to the phase difference; and when phases of the local clock signal and the received clock signal are aligned, utilizing the local clock signal as the first clock signal and outputting the same to the eye pattern measurement apparatus;

a charge pump, connected to the phase detector, converting the first control signal outputted by the phase detector to a corresponding current signal;

a loop filter, connected to the charge pump, generating a second control signal matching the current signal outputted by the charge pump; and a voltage-controlled oscillator, connected to the loop filter and the phase detector, adjusting a frequency of the local clock signal and outputting the local clock signal to the phase detector.

14. A clock and data recovery method, comprising:

performing first sampling on a data signal by sequentially using a plurality of scan clock signals having different phases to obtain a plurality of scan data signals, wherein, periods of the plurality of scan clock signals are equal to a period of a first clock signal;

performing phase-shift on the first clock signal to generate a synchronization clock signal, wherein a phase relationship between the synchronization clock signal and the plurality of scan data signals satisfies a setup/hold time requirement;

synchronizing the plurality of scan data signals and the synchronization clock signal to obtain a plurality of synchronized scan data signals; wherein, a phase of the synchronization clock signal further satisfies a condition that, a phase relationship between the plurality of scan data signals synchronized by the synchronization clock signal and the first clock signal further satisfies the setup/hold time requirement.

15. The clock and data recovery method according to claim 14, before the step of performing the first sampling on the data signals by sequentially using the plurality of scan clock signals having different phases, further comprising:

extracting a first clock signal synchronous with the received data signal from the data signal.

* * * * *